United States Patent
Zhu et al.

(10) Patent No.: US 10,777,126 B2
(45) Date of Patent: Sep. 15, 2020

(54) ARRAY SUBSTRATE AND PREPARING METHOD THEREOF, DISPLAY DEVICE AND DRIVING METHOD THEREOF

(71) Applicant: BOE TECHNOLOGY GROUP CO., LTD., Beijing (CN)

(72) Inventors: Wenxiu Zhu, Beijing (CN); Shiming Shi, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/328,820

(22) PCT Filed: Jun. 28, 2018

(86) PCT No.: PCT/CN2018/093315
§ 371 (c)(1),
(2) Date: Feb. 27, 2019

(87) PCT Pub. No.: WO2019/033858
PCT Pub. Date: Feb. 21, 2019

(65) Prior Publication Data
US 2019/0244562 A1   Aug. 8, 2019

(30) Foreign Application Priority Data

Aug. 18, 2017   (CN) .......................... 2017 1 0712970

(51) Int. Cl.
*G09G 3/32* (2016.01)
*G09G 3/3208* (2016.01)
(Continued)

(52) U.S. Cl.
CPC ......... *G09G 3/3208* (2013.01); *G06K 9/0004* (2013.01); *H01L 21/56* (2013.01);
(Continued)

(58) Field of Classification Search
CPC ......... G06K 9/0004; G09G 2320/0233; G09G 2354/00; G09G 3/3208; H01L 21/56;
(Continued)

(56) References Cited

U.S. PATENT DOCUMENTS 8,698,265 B2   4/2014 Yoon
10,593,737 B2 *   3/2020 Bok ..................... H01L 27/3225
(Continued)

FOREIGN PATENT DOCUMENTS

CN   105336751 A   2/2016
CN   105702176 A   6/2016
(Continued)

OTHER PUBLICATIONS

Search Report and Written Opinion for International Application No. PCT/CN2018/093315 dated Sep. 30, 2018.

*Primary Examiner* — Tony O Davis
(74) *Attorney, Agent, or Firm* — Calfee, Halter & Griswold LLP

(57) ABSTRACT

An array substrate and a method for preparing the same, and a display device and a driving method thereof are provided. The array substrate includes a plurality of sub-pixels arranged in an array and a light source, the array substrate is further provided with an optical fingerprint identification area, and the optical fingerprint identification area includes at least part of the sub-pixels and at least part of the light source.

18 Claims, 4 Drawing Sheets

(51) Int. Cl.
*H01L 27/32* (2006.01)
*H01L 51/50* (2006.01)
*H01L 51/52* (2006.01)
*H01L 51/56* (2006.01)
*G06K 9/00* (2006.01)
*H01L 21/56* (2006.01)
*H01L 27/146* (2006.01)

(52) U.S. Cl.
CPC ............ *H01L 27/32* (2013.01); *H01L 27/323* (2013.01); *H01L 27/326* (2013.01); *H01L 27/3211* (2013.01); *H01L 27/3234* (2013.01); *H01L 27/3244* (2013.01); *H01L 51/5056* (2013.01); *H01L 51/5218* (2013.01); *H01L 51/5221* (2013.01); *H01L 51/5253* (2013.01); *H01L 51/5265* (2013.01); *H01L 51/56* (2013.01); *G09G 2320/0233* (2013.01); *G09G 2354/00* (2013.01); *H01L 27/14678* (2013.01); *H01L 2227/323* (2013.01); *H01L 2251/558* (2013.01)

(58) Field of Classification Search
CPC ......... H01L 2227/323; H01L 2251/558; H01L 27/14678; H01L 27/32; H01L 27/3211; H01L 27/323; H01L 27/3234; H01L 27/3244; H01L 27/326; H01L 51/5056; H01L 51/5218; H01L 51/5221; H01L 51/5253; H01L 51/5265; H01L 51/56
See application file for complete search history.

(56) References Cited

U.S. PATENT DOCUMENTS

| | | |
|---|---|---|
| 2012/0001286 A1 | 1/2012 | Yoon |
| 2017/0372113 A1 | 12/2017 | Zhang et al. |
| 2018/0096188 A1 | 4/2018 | Xu |
| 2018/0122863 A1* | 5/2018 | Bok .................... H01L 27/3225 |
| 2018/0129852 A1 | 5/2018 | Zeng et al. |
| 2019/0012512 A1* | 1/2019 | He ..................... G06K 9/00087 |

FOREIGN PATENT DOCUMENTS

| | | |
|---|---|---|
| CN | 106024836 A | 10/2016 |
| CN | 106971181 A | 7/2017 |
| CN | 106981503 A | 7/2017 |
| CN | 107025451 A | 8/2017 |
| CN | 105336751 B | 6/2018 |
| KR | 101688084 B1 | 12/2016 |

* cited by examiner

_US 10,777,126 B2_

ARRAY SUBSTRATE AND PREPARING METHOD THEREOF, DISPLAY DEVICE AND DRIVING METHOD THEREOF

CROSS-REFERENCE TO RELATED APPLICATIONS

This application is based upon International Application No. PCT/CN2018/093315, filed on Jun. 28, 2018, which claims the priority to the Chinese Patent Application No. 201710712970.8, entitled "OLED PANEL AND PREPARING METHOD THEREOF, OLED DISPLAY DEVICE AND DRIVING METHOD THEREOF" filed on Aug. 18, 2017, the entire content of which is incorporated herein by reference.

TECHNICAL FIELD

The present disclosure relates to the field of display technologies, and more particularly, to an array substrate and a preparing method thereof, a display device and a driving method thereof.

BACKGROUND

OLED (Organic Light Emitting Diode) is widely used in high-performance display as a current-type light-emitting device with advantages such as self-illumination, fast response, wide viewing angle, and application in flexible substrates.

In an OLED display screen with optical fingerprint identification function, part of an effective display area (A-A area) is used as an optical fingerprint identification area. However, after a period of use, the optical fingerprint identification area may have different brightness from other areas of the A-A area, which may affect the OLED display effect.

It is to be noted that the above information disclosed in this Background section is only for enhancement of understanding of the background of the present disclosure and therefore it may contain information that does not form the prior art that is already known to a person of ordinary skill in the art.

SUMMARY

Embodiments of the present disclosure relate to an array substrate and a preparing method thereof, a display device and a driving method thereof.

Other features and advantages of the present disclosure will be apparent from the following detailed description, or partly obtained from the practice of the present disclosure.

According to an aspect of the present disclosure, there is provided an array substrate, including a plurality of sub-pixels arranged in an array and a light source. The array substrate is further provided with an optical fingerprint identification area, and the optical fingerprint identification area includes at least part of the sub-pixels and at least part of the light source.

According to an exemplary embodiment of the present disclosure, the light source is located within the optical fingerprint identification area.

According to an exemplary embodiment of the present disclosure, the optical fingerprint identification area includes all of the sub-pixels and the light source.

According to an exemplary embodiment of the present disclosure, the light source includes a plurality of light emitting units, and at least one of the light emitting units is located between adjacent sub-pixels of the sub-pixels.

According to an exemplary embodiment of the present disclosure, the light emitting unit includes a first microcavity structure, and the first microcavity structure includes: a first electrode; a second electrode; and a first light emitting layer between the first electrode and the second electrode.

According to an exemplary embodiment of the present disclosure, the sub-pixel includes a second microcavity structure, and the second microcavity structure includes: a third electrode; a fourth electrode; and a second light emitting layer between the third electrode and the fourth electrode.

According to an exemplary embodiment of the present disclosure, a thickness of the first microcavity structure is greater than a thickness of the second microcavity structure.

According to an exemplary embodiment of the present disclosure, the first electrode and the third electrode are transflective electrodes, and the second electrode and the fourth electrode are reflective electrodes.

According to an exemplary embodiment of the present disclosure, a thickness of the first electrode is greater than a thickness of the third electrode.

According to an exemplary embodiment of the present disclosure, the thickness of the first electrode is greater than the thickness of the third electrode by 6 to 8 nm.

According to an exemplary embodiment of the present disclosure, the first light emitting layer and the second light emitting layer are organic light emitting layers including a hole transport layer, and a thickness of the hole transport layer in the first light emitting layer is greater than a thickness of the hole transport layer in the second light emitting layer.

According to an exemplary embodiment of the present disclosure, the first light emitting layer includes a green light emitting material.

According to an exemplary embodiment of the present disclosure, the first electrode and the third electrode are formed integrally.

According to an exemplary embodiment of the present disclosure, the array substrate further includes: a capping layer disposed on a surface of the first electrode and the third electrode formed integrally away from the second electrode and the fourth electrode.

According to another aspect of the present disclosure, there is provided a method of preparing an array substrate, including: forming a plurality of sub-pixels arranged in an array on a substrate; and forming a light source between adjacent sub-pixels of the sub-pixels in an area. The area is an optical fingerprint identification area, and the optical fingerprint identification area includes at least part of the sub-pixels and at least part of the light source.

According to further another aspect of the present disclosure, there is provided a display device, including: the array substrate according to any one of the above embodiments; a first driving circuit configured to control each of the sub-pixels to emit light for displaying an image during an image display phase; and a second driving circuit configured to control the light source to emit light as a light source for optical fingerprint identification in an optical fingerprint identification phase.

According to yet another aspect of the present disclosure, there is provided a driving method of a display device for driving the above display device, including: in the image display phase, controlling, by using the first driving circuit, each of the sub-pixels to emit light for displaying an image; and in the optical fingerprint identification phase, controlling, by using the second driving circuit, the light source to emit light as a light source for optical fingerprint identification.

It is to be understood that the above general description and the following detailed description are intended to be illustrative and not restrictive.

BRIEF DESCRIPTION OF THE DRAWINGS

The accompanying drawings herein are incorporated in and constitute a part of this specification, illustrate embodiments conforming to the present disclosure and together with the description serve to explain the principles of the present disclosure. Apparently, the accompanying drawings in the following description show merely some embodiments of the present disclosure, and persons of ordinary skilled in the art may still derive other drawings from these accompanying drawings without creative efforts.

DETAILED DESCRIPTION

Figure 1:
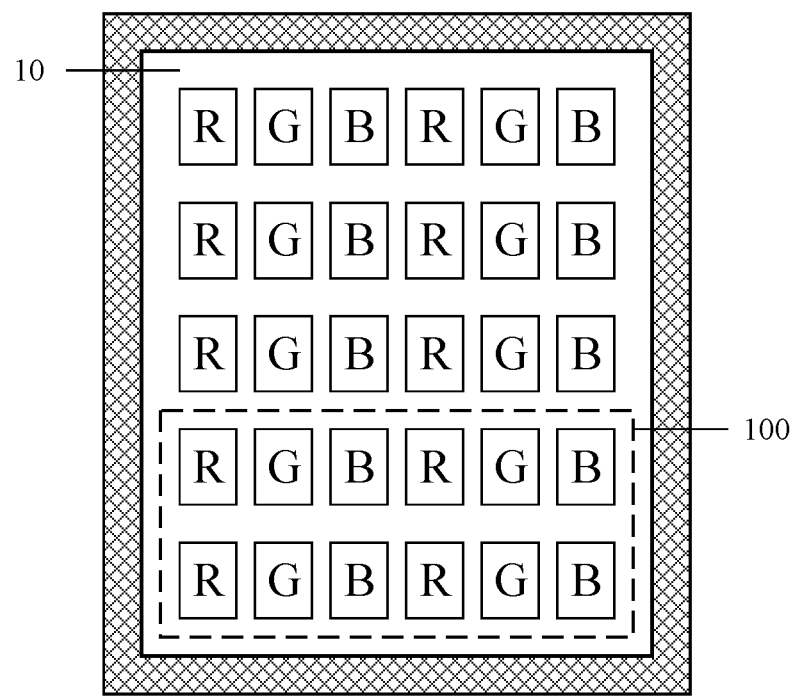
FIG. 1 is a schematic view schematically showing an OLED display screen having an optical fingerprint identification function in the related art.

The exemplary embodiment will now be described more fully with reference to the accompanying drawings. However, the exemplary embodiments can be implemented in a variety of forms and should not be construed as limited to the embodiments set forth herein. Rather, the embodiments are provided so that this disclosure will be thorough and complete and will fully convey the concepts of exemplary embodiments to those skilled in the art. The features, structures, or characteristics described may be combined in one or more embodiments in any suitable manner. In the following description, numerous specific details are provided to give a full understanding of the embodiments of the present disclosure. However, those skilled in the art will appreciate that the technical solutions of the present disclosure may be practiced without practicing one or more of the specific details, and other methods, components, devices, steps, and the like may be employed. In other instances, well-known technical solutions are not shown or described in detail to avoid obscuring aspects of the present disclosure.

Spatially relative terms, such as "beneath," "below," "lower," "above," "upper" and the like, may be used herein for ease of description to describe one element or feature's relationship to another element(s) or feature(s) (or other elements or features) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

In addition, the accompanying drawings are merely exemplary illustration of the present disclosure, and are not necessarily drawn to scale. The thicknesses and shapes of the various layers in the drawings do not reflect true proportions, only for the purpose of illustrating the present disclosure. The same reference numerals in the drawings denote the same or similar parts, and thus repeated description thereof will be omitted.

As shown in FIG. 1, generally, an OLED display screen with an optical fingerprint identification function uses a part of the effective display area (A-A area) 10 as an optical fingerprint identification area 100, and uses the light emitted by the OLED display screen itself as a light source for optical fingerprint identification so as to achieve the optical fingerprint identification function. For quick and stable optical fingerprint identification, the reflected light received by the sensor needs to have sufficient intensity, which requires that the brightness of light emitted by the OLED in the optical fingerprint identification area is significantly higher than the brightness thereof required for normal display.

However, the T95 of the OLED in the normal brightness mode is about 240 hours, and the T95 in the high brightness mode with double brightness is only 29 hours. The T95 is an index for assessing the lifetime of the OLED, and specifically refers to the time required when the brightness of the OLED drops to 95% of the initial brightness. It can be seen that the high brightness mode with double brightness has a significant effect on the lifetime of the OLED compared to the normal brightness mode. Assuming that the optical fingerprint identification is used 200 times a day and for 0.2 seconds for each time, the optical fingerprint identification area would be used for about more 4 hours than the other areas of the A-A area in one year, and as the usage time increases, the difference between the brightness of the optical fingerprint identification area and that of the other areas in the A-A area would be increased gradually. In the actual display, when it has a brightness difference of 0.8% between adjacent areas, the human eyes can perceive the brightness difference. In this way, the brightness difference between the optical fingerprint identification area and the other areas of the A-A area would affects the OLED display effect.

An array substrate and a method of preparing the same, a display device and a method of driving the same according to an exemplary embodiment of the present disclosure will be described in detail below with reference to the accompanying drawings. Although an OLED panel and an OLED display device are taken as an example to illustrate the array substrate and the method of preparing the same, the display device and the method of driving the same according to the present disclosure, those skilled in the art will recognize that the present disclosure is not limited thereto, for example, the technical concept of the present disclosure can also be applied to QLED (Quantum Dot Light Emitting Diode) panels and QLED display devices.

Figure 2:
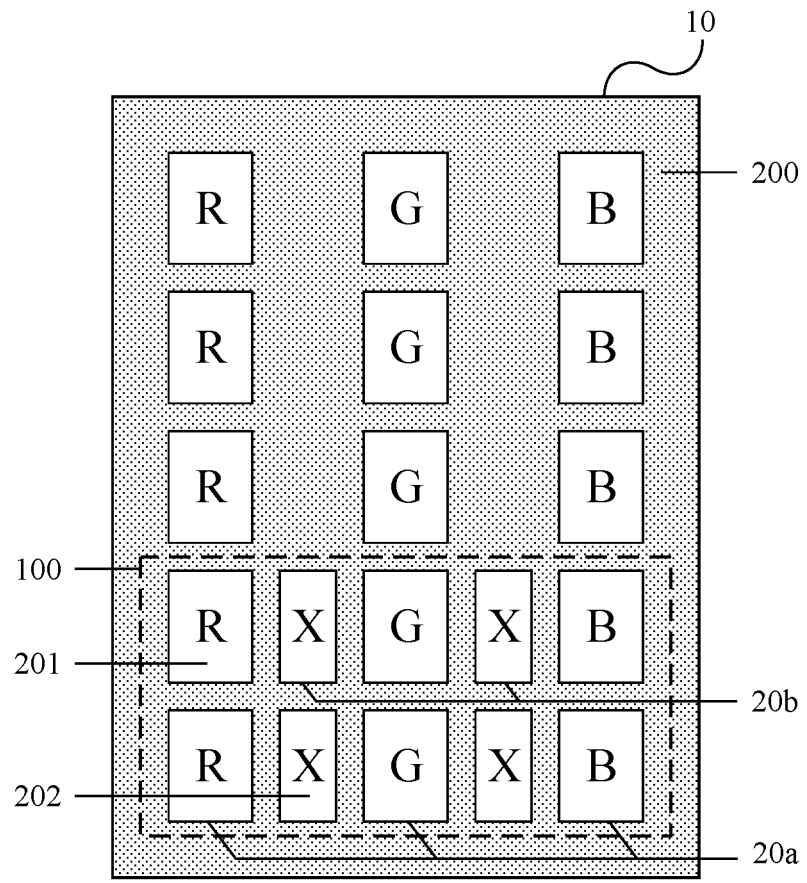
FIG. 2 is a schematic view schematically showing an OLED panel having an optical fingerprint identification function in an exemplary embodiment of the present disclosure.

The present exemplary implementation provides an array substrate. FIG. 2 shows an OLED panel as an array substrate, but the present disclosure is not limited thereto. For example, the array substrate may also be a QLED (Quantum Dot Light Emitting Diode) panel. As shown in FIG. 2, the OLED panel includes a plurality of sub-pixels 201 arranged in an array and a light source 202. An optical fingerprint identification area 100 is further disposed on the OLED panel, and the optical fingerprint identification area 100 may include part of the sub-pixels 201 and the light source 202. However, the present disclosure is not limited thereto, and for example, the optical fingerprint identification area 100 may include all of the sub-pixels and the light source.

The sub-pixel 201 may be disposed in a first light emitting area 20a in an effective display area 10 of the OLED panel for displaying an image. The light source 202 may be disposed in a second light emitting area 20b in the effective display area 10 of the OLED panel to be served as a light source for optical fingerprint identification. The first light emitting area 20a and the second light emitting area 20b may be defined by the pixel defining layer 200 to provide a space for vaporizing organic light emitting material.

It should be noted that although the optical fingerprint identification area 100 includes a plurality of sub-pixels 201 and the light source 202 at the same time, and the sub-pixels 201 can also be used for emitting light, in the present embodiment, only the above light source 202 is used as the light source for optical fingerprint identification.

In the OLED panel provided by the exemplary implementation of the present disclosure, the light source 202 special for optical fingerprint identification is additionally disposed in the optical fingerprint identification area 100, so that the uneven brightness can be prevented effectively when an image is displayed on the optical fingerprint identification area 100 and the other areas of the effective display area 10, therefore the display quality of the OLED display can be ensured and thus a good overall visual effect may be presented to users.

Based on the above structure, as shown in FIG. 2, the sub-pixels 201 may include a red sub-pixel R, a green sub-pixel G, and a blue sub-pixel B that are periodically spaced apart. The light source 202 may include a plurality of light emitting units X, and any one of the light emitting units X is located between the adjacent sub-pixels 201.

Figure 3:
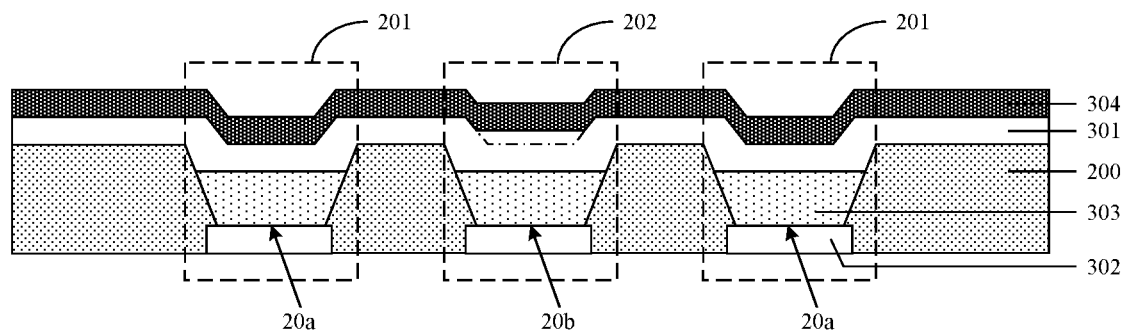
FIG. 3 is a schematic cross-sectional view showing an OLED panel in an exemplary embodiment of the present disclosure.

In the exemplary implementation, as shown in FIG. 3, each of the sub-pixel 201 and the light-emitting unit may include: a first electrode 301; a second electrode 302; and a light emitting layer between the first electrode 301 and the second electrode 302, such as an organic light emitting layer 303.

One of the first electrode 301 and the second electrode 302 is a transflective electrode and the other one is a reflective electrode. The organic light emitting layer 303 may include a hole injection layer, a hole transport layer, and an electron-hole composite layer, an electron transport layer, and an electron injection layer.

In this way, the first electrode 301 and the second electrode 302 which are parallel to each other and the organic light emitting layer 303 located therebetween can constitute an OLED microcavity structure. On the basis of the above, it is considered that the light emitting unit is used as a light source for optical fingerprint identification, which should have a high luminous efficiency, therefore in the present embodiment, the thickness of the microcavity structure corresponding to the light emitting unit can be controlled to be larger than the thickness of the microcavity structure corresponding to the sub-pixel 201, such that the light emitting unit has lower power consumption and higher luminous efficiency.

In one implementation, the first electrode 301 may be a transflective electrode, the second electrode 302 may be a reflective electrode, and the thickness of the transflective electrode corresponding to the light emitting unit may be greater than that of the transflective electrode corresponding to the sub-pixel 201 by, for example, 6 to 8 nm and preferably 7 nm, so that the power consumption of the light-emitting unit can be effectively reduced and the luminous efficiency thereof can be enhanced. Specifically, the thickness of each of the electrodes corresponding to the sub-pixels 201 may be the same as that in the prior art, and the thickness of the reflective electrode corresponding to the light emitting unit is constant, and the thickness of the transflective electrode corresponding to the light emitting unit is increased. In this case, the thickness of the microcavity structure corresponding to the light emitting unit is changed, thereby reducing the power consumption of the light emitting unit and enhancing the luminous efficiency thereof.

In another implementation, the thickness of the hole transport layer in the organic light emitting layer 303 corresponding to the light emitting unit may be greater than the thickness of the hole transport layer in the organic light emitting layer 303 corresponding to the sub pixel 201. In this case, the thickness of the microcavity structure corresponding to the light emitting unit is changed, thereby reducing the power consumption of the light emitting unit and enhancing the luminous efficiency thereof.

It should be noted that in the above two implementations, the increasing of the thickness of the transflective electrode increases the luminous efficiency without substantially causing the shift of the spectral peak, however the increasing of the thickness of the hole transport layer to increase the luminous efficiency may cause the shift of the spectral peak, and in this case, in order to ensure no shift of the spectrum peak, it is necessary to changing the thicknesses of the other layers when changing the thickness of the hole transport layer. Therefore, the present disclosure preferably improves the luminous efficiency of the light emitting unit by changing the thickness of the electrode.

Figure 4:
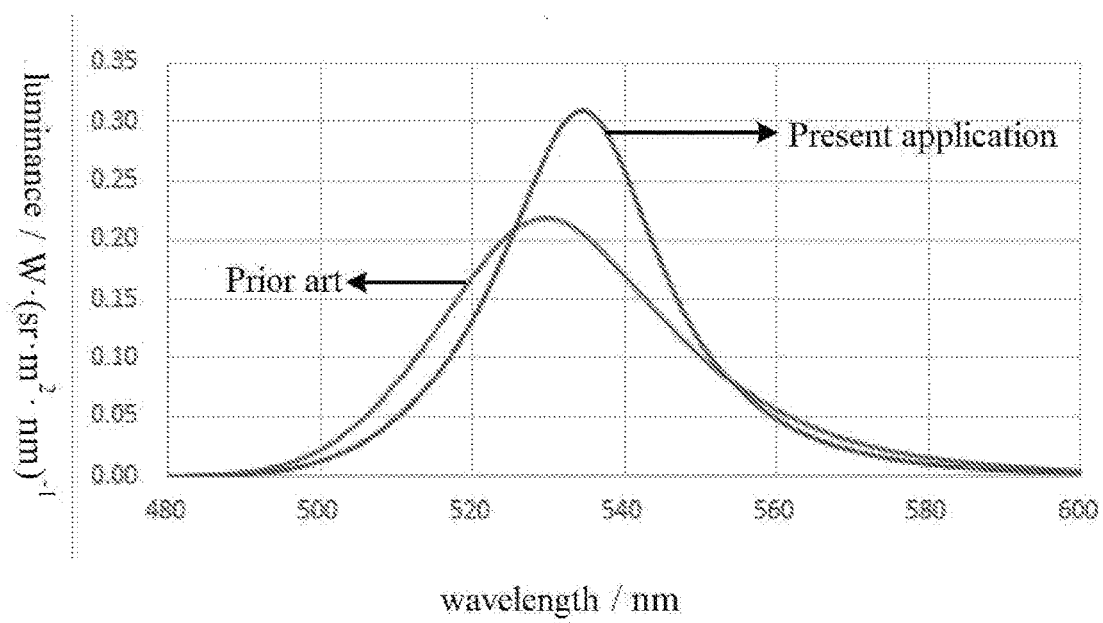
FIG. 4 schematically shows a spectrogram of a light emitting pixel in an exemplary embodiment of the present disclosure.

In the exemplary implementation, the organic light emitting material in the light emitting unit may be a green light emitting material, and of course, other colors of light emitting material are not excluded. Compared with other colors of light emitting materials, the green organic light emitting material requires less power consumption and has higher luminous efficiency when reaching the same brightness, and thus is the best choice in the present embodiment. Referring to FIG. 4, as for increasing the thickness of the transflective electrode, it was verified that the luminous efficiency of the light emitting pixel 202 formed based on the green light emitting material can be improved by about 10%.

In the above OLED panel, the first electrode 301 may be a cathode, which may be, for example, a magnesium silver electrode, and the second electrode 302 may be an anode, which may be, for example, a gold electrode. On the basis of the above, as shown in FIG. 3, the OLED panel may further include a capping layer (CPL) 304 disposed on a side of the first electrode 301 facing away from the second electrode 302. In this way, by providing the capping layer 304 over the cathode, the present embodiment may not only improve the luminous efficiency, but also protect the cathode material which is easily oxidizable.

Figure 5:
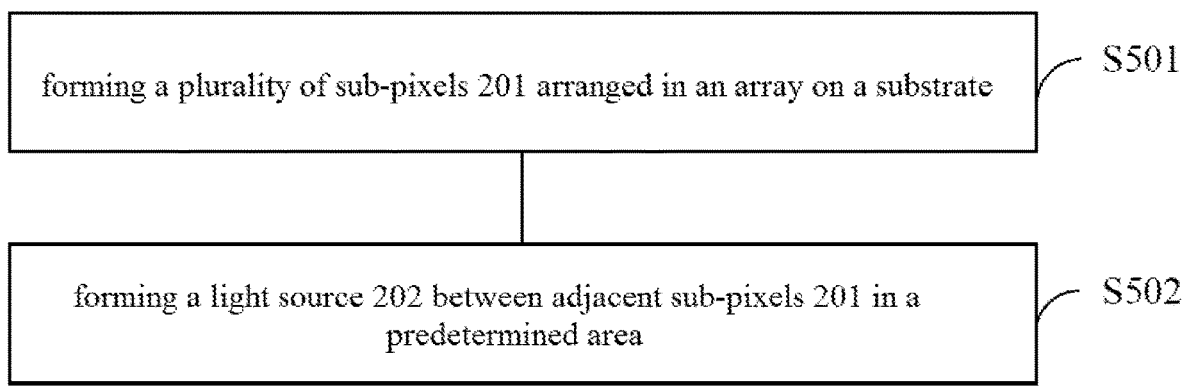
FIG. 5 is a flow chart schematically showing a method of preparing an OLED panel in an exemplary embodiment of the present disclosure.

The exemplary implementation further provides a method for preparing an OLED panel. As shown in FIG. 5, the method may include:

S501, forming a plurality of sub-pixels 201 arranged in an array on a substrate; and S502, forming a light source 202 between adjacent sub-pixels 201 in a predetermined area.

The predetermined area is the optical fingerprint identification area 100, and the optical fingerprint identification area 100 may include part of the sub-pixels 201 and the light source 202.

For example, the specific steps for preparing the OLED panel may include: preparing a pixel defining layer 200 on the substrate to define a plurality of first light emitting areas 20a and a second light emitting area 20b between the adjacent first light emitting areas 20a in a predetermined region, as shown in FIG. 3; and preparing a plurality of sub-pixels 201 arranged in an array in the first light emitting areas 20a for image display, and preparing a plurality of light emitting units in the second light emitting areas 20b to be served as a light source for optical fingerprint identification, as shown in FIG. 2.

In the present embodiment, each of the sub-pixel 201 and the light-emitting unit may include a first electrode 301 and a second electrode 302, and an organic light emitting layer 303 therebetween. The first electrode 301 may be, for example, a transflective cathode, and the second electrode 302 may be, for example, a reflective anode, so that an OLED microcavity structure can be formed.

In the OLED panel prepared according to the above steps, a predetermined area is used as the optical fingerprint identification area 100, and the optical fingerprint identification area 100 includes part of the sub-pixels 201 and the light source 202, so that the uneven brightness can be prevented effectively when an image is displayed on the optical fingerprint identification area 100 and the other areas of the effective display area 10, therefore the display quality of the OLED display can be ensured and thus a good overall visual effect may be presented to users.

In the present exemplary implementation, when the sub-pixel 201 and the light emitting unit are prepared, the thickness of the first electrode 301 corresponding to the light emitting unit may be controlled to be greater than the thickness of the first electrode 301 corresponding to the sub-pixel 201, alternatively the thickness of the hole transport layer in the organic light emitting layer 303 corresponding to the light emitting unit may be controlled to be greater than the thickness of the hole transport layer in the organic light emitting layer 303 corresponding to the sub-pixel 201, so as to reduce the power consumption of the light emitting unit.

When green light emitting material is selected as the organic light emitting material in the light emitting unit, the light emitting efficiency of the light emitting unit can be further improved.

It should be noted that the specific details of the method for preparing the OLED panel have been described in detail in the description of the corresponding OLED panel, and are not described herein again.

The exemplary implementation further provides an OLED display device including the above OLED panel and a driving circuit.

The driving circuit may include:

a first driving circuit, configured to control each of the sub-pixels 201 to emit light to display an image during an image display phase; and a second driving circuit, configured to control the light source 202, that is, each of the light emitting units to emit light as a light source for optical fingerprint identification during an optical fingerprint identification.

In this embodiment, since the brightness of the light emitting unit used as the light source for optical fingerprint identification does not need to be adjusted complicatedly, the structure of the second driving circuit can be relatively simpler than the structure of the first driving circuit.

It should be noted that, in this embodiment, the same driving circuit can be used for the sub-pixel 201 for performing image display and the light emitting unit used as the light source for optical fingerprint identification, but the design of the driving circuit is complicated. In considering of the process complexity, the embodiment preferably adopts the above-described driving circuit design manner, that is, the first driving circuit and the second driving circuit are respectively disposed for the sub-pixel 201 and the light source 202.

Correspondingly, the exemplary implementation further provides a driving method of an OLED display device for driving the OLED display device described above.

Figure 6:
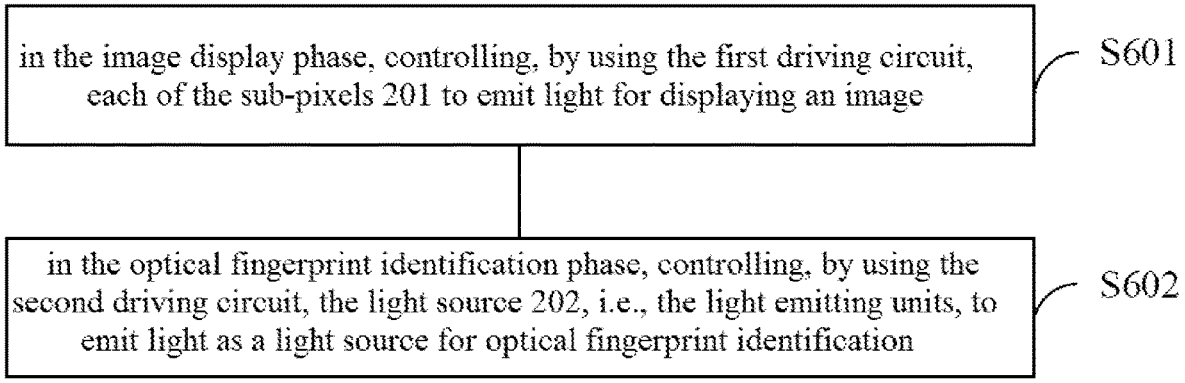
FIG. 6 is a flow chart schematically showing a driving method of an OLED display device in an exemplary embodiment of the present disclosure.

As shown in FIG. 6, the driving method may include:

S601, in the image display phase, controlling, by using the first driving circuit, each of the sub-pixels 201 to emit light for displaying an image; and S602, in the optical fingerprint identification phase, controlling, by using the second driving circuit, the light source 202, i.e., the light emitting units, to emit light as a light source for optical fingerprint identification.

Based on this, when performing optical fingerprint identification, the second driving circuit can control the light emitting units to emit light as a light source for optical fingerprint identification; while performing image display, the first driving circuit can control each of the sub-pixels 201 to emit light for image display.

In this way, the OLED unit used as the light source for optical fingerprint identification and the OLED unit for image display are independent from each other. Even if the light emitting unit used as the light source for optical fingerprint identification has higher luminance, which has great influence on the lifetime of the OLED, since each of the sub-pixels 201 for image display and the light emitting unit are independent from each other, and the luminance of the sub-pixels 201 has balanced effect on the lifetime of the OLED, the display quality of the OLED display may be ensured and a good visual effect may be presented to users.

It should be noted that the image display phase and the optical fingerprint identification phase described herein may be overlapped in time; that is, while the first driving circuit drives each of the sub-pixels 201 to display an image, the second driving circuit can also drive each of the light emitting units to emit light as a light source for optical fingerprint identification.

In the exemplary implementation, the OLED display device may be a top emission type, a bottom emission type, or a double-sided emission type display device, which may include any product or component having a display function such as a mobile phone, a tablet computer, a television, a notebook computer, a digital photo frame, and a navigator, and the present disclosure is not limited thereto.

Other embodiments of the present disclosure will be apparent to those skilled in the art after consideration of the specification and practice of the invention disclosed herein. This application is intended to cover any variations, uses, or adaptations of the present disclosure following the general principles thereof and including such departures from the present disclosure as come within known or customary practice in the art. The specification and embodiments are considered as being exemplary only, with a true scope and spirit of the present disclosure being indicated by the appended claims It is to be understood that the present disclosure is not limited to the specific structures described above and shown in the figures, and can be modified and changed variously without departing from the scope of the present disclosure. The scope of the present disclosure is only defined by the appended claims.

What is claimed is:

1. An array substrate, comprising a plurality of sub-pixels arranged in an array and a light source,
   wherein the array substrate is further provided with an optical fingerprint identification area, and the optical fingerprint identification area comprises at least part of the sub-pixels and at least part of the light source,
   wherein the light source comprises a plurality of light emitting units, and at least one of the light emitting units is located between adjacent sub-pixels of sub-pixels,
   wherein the light emitting unit comprises a first microcavity structure, and the first microcavity structure comprises:
   a first electrode,
   a seconf electrode; and
   a first light emitting layer between the first electrode and the second electrode.

2. The array substrate of claim 1, wherein the light source is located within the optical fingerprint identification area.

3. The array substrate of claim 1, wherein the optical fingerprint identification area comprises all of the sub-pixels and the light source.

4. The array substrate of claim 1, wherein the sub-pixel comprises a second microcavity structure, and the second microcavity structure comprises:
   a third electrode;
   a fourth electrode; and
   a second light emitting layer between the third electrode and the fourth electrode.

5. The array substrate of claim 4, wherein a thickness of the first microcavity structure is greater than a thickness of the second microcavity structure.

6. The array substrate of claim 4, wherein the first electrode and the third electrode are transflective electrodes, and the second electrode and the fourth electrode are reflective electrodes.

7. The array substrate of claim 4, wherein a thickness of the first electrode is greater than a thickness of the third electrode.

8. The array substrate of claim 7, wherein the thickness of the first electrode is greater than the thickness of the third electrode by 6 to 8 nm.

9. The array substrate of claim 4, wherein the first light emitting layer and the second light emitting layer are organic light emitting layers including a hole transport layer, and wherein a thickness of the hole transport layer in the first light emitting layer is greater than a thickness of the hole transport layer in the second light emitting layer.

10. The array substrate of claim 4, wherein the first electrode and the third electrode are formed integrally.

11. The array substrate according to claim 10, further comprising: a capping layer disposed on a surface of the first electrode and the third electrode formed integrally away from the second electrode and the fourth electrode.

12. The array substrate of claim 1, wherein the first light emitting layer comprises a green light emitting material.

13. A display device, comprising:
   the array substrate according to claim 1;
   a first driving circuit, configured to control each of the sub-pixels to emit light for displaying an image during an image display phase; and
   a second driving circuit, configured to control the light source to emit light as a light source for optical fingerprint identification in an optical fingerprint identification phase.

14. A driving method of a display device for driving the display device of claim 13, comprising:
   in the image display phase, controlling, by using the first driving circuit, each of the sub-pixels to emit light for displaying an image; and
   in the optical fingerprint identification phase, controlling, by using the second driving circuit, the light source to emit light as a light source for optical fingerprint identification.

15. The display device of claim 13, wherein the light source is located within the optical fingerprint identification area.

16. The display device of claim 13, wherein the optical fingerprint identification area comprises all of the sub-pixels and the light source.

17. The display device of claim 13, wherein the light source comprises a plurality of light emitting units, and at least one of the light emitting units is located between adjacent sub-pixels of the sub-pixels.

18. A method of preparing an array substrate, comprising:
   forming a plurality of sub-pixels arranged in an array on a substrate; and
   forming a light source between adjacent sub-pixels of the sub-pixels in an area,
   wherein the area is an optical fingerprint identification area, and the optical fingerprint identification area comprises at least part of the sub-pixels and at least part of the light source,
   wherein the light source comprises a plurality of light emitting units, and the at least one of the light emitting units is located between adjacent sub-pixels of the sub-pixels,
   wherein the light emitting unit comprises a first microcavity structure, and the first microcavity structure comprises:
   a first electrode;
   a second electrode; and
   a first light emitting layer between the first electrode and te second electrode.

* * * * *